(12) United States Patent
Taniguchi et al.

(10) Patent No.: US 7,967,654 B2
(45) Date of Patent: Jun. 28, 2011

(54) ORGANIC ELECTROLUMINESCENCE ELEMENT, PROCESS FOR PREPARATION OF THE SAME, AND ELECTRODE FILM

(75) Inventors: Yoshio Taniguchi, Nagano (JP); Masato Sugiyama, Kanagawa (JP); Shingo Hibino, Aichi (JP); Tetsuya Takeuchi, Aichi (JP); Ryo Minoshima, Aichi (JP)

(73) Assignees: Yoshio Taniguchi, Ueda-shi, Magano (JP); Tokai Rubber Industries, Ltd., Komaki-shi, Aichi (JP)

( * ) Notice: Subject to any disclaimer, the term of this patent is extended or adjusted under 35 U.S.C. 154(b) by 68 days.

(21) Appl. No.: 12/173,540

(22) Filed: Jul. 15, 2008

(65) Prior Publication Data
US 2009/0023232 A1   Jan. 22, 2009

Related U.S. Application Data

(63) Continuation of application No. 10/562,201, filed on Dec. 23, 2005, now abandoned.

(30) Foreign Application Priority Data

Jun. 25, 2003  (JP) .................................. 2003-181666
Mar. 1, 2004   (JP) .................................. 2004-056606

(51) Int. Cl.
  *H01J 9/26*    (2006.01)
  *H01J 9/32*    (2006.01)

(52) U.S. Cl. ............... 445/25; 445/23; 445/24; 313/504; 313/506; 313/512

(58) Field of Classification Search .......... 313/498–512; 438/20; 445/23–25
See application file for complete search history.

(56) References Cited

U.S. PATENT DOCUMENTS

| | | | | |
|---|---|---|---|---|
| 5,189,405 A | * | 2/1993 | Yamashita et al. | 313/512 |
| 5,273,608 A | * | 12/1993 | Nath | 156/301 |
| 5,965,979 A | * | 10/1999 | Friend et al. | 313/504 |
| 6,420,200 B1 | * | 7/2002 | Yamazaki et al. | 438/30 |
| 6,570,325 B2 | * | 5/2003 | Graff et al. | 313/506 |
| 7,005,798 B2 | | 2/2006 | Carcia et al. | |
| 2002/0158577 A1 | * | 10/2002 | Shimoda et al. | 313/506 |
| 2003/0164497 A1 | * | 9/2003 | Carcia et al. | 257/40 |

FOREIGN PATENT DOCUMENTS

| | | |
|---|---|---|
| JP | 07-153571 | 6/1995 |
| JP | 2000-164353 | 6/2000 |

(Continued)

OTHER PUBLICATIONS

International Preliminary Report on Patentability and Written Opinion of the International Searching Authority PCT/JP2004/008995, mailed Apr. 24, 2006.

*Primary Examiner* — Nimeshkumar D Patel
*Assistant Examiner* — Thomas A Hollweg
(74) *Attorney, Agent, or Firm* — Nixon Peabody LLP; Jeffrey L. Costellia

(57) ABSTRACT

An organic electroluminescence element has a layered structure on a surface of a transparent substrate. The layered structure comprises an organic material layer including a light-emitting organic material layer, an opaque electrode layer, an insulating layer, a metal layer and a resin film in order. The organic electroluminescence element is improved in durability because moisture is prevented from permeating into a light-emitting element.

7 Claims, 6 Drawing Sheets

FOREIGN PATENT DOCUMENTS

| | | |
|---|---|---|
| JP | 2002-203675 | 7/2002 |
| JP | 2002-221911 | 8/2002 |
| JP | 2002-252080 | 9/2002 |
| JP | 2002-361742 | 12/2002 |
| JP | 2003-059646 | 2/2003 |
| JP | 2001-237065 | 8/2008 |
| WO | WO 02/05361 A1 | 1/2002 |
| WO | WO 03/022575 A1 | 3/2003 |

* cited by examiner

ORGANIC ELECTROLUMINESCENCE ELEMENT, PROCESS FOR PREPARATION OF THE SAME, AND ELECTRODE FILM

FIELD OF THE INVENTION

The present invention relates to an organic electroluminescence element, a process for preparation of the same, and an electrode film.

BACKGROUND OF THE INVENTION

The organic electroluminescence element has a basic structure comprising on a surface of a transparent glass substrate, a transparent electrode layer, a light-emitting organic material layer and an opaque electrode layer in order. The transparent electrode layer is an anode (positive electrode) layer. The transparent electrode layer generally comprises a transparent electroconductive material such as ITO (indium oxide doped with tin). The opaque electrode layer, which comprises a metal material such as Mg—Ag alloy, is a cathode (negative electrode) layer.

The organic electroluminescence element is a light-emitting element, which emits light (fluorescence, phosphorescence) by injecting a positive hole from an anode layer and an electron from a cathode layer into a light-emitting organic material layer, recombining the positive hole and the electron in the light-emitting organic material layer to form an exciton, and inactivating the exciton. The light given in the light-emitting organic material layer is taken out of the light-emitting element through a transparent glass substrate.

A positive hole-transporting layer has been proposed to be provided between the light-emitting organic material layer and the anode layer to improve efficiency of injection of the positive hole into the light-emitting organic material layer. An electron-transporting layer has also been proposed to be provided between the organic material layer and the cathode layer to improve efficiency of injection of the electron into the light-emitting organic material layer. Each of the positive hole-transporting layer and the electron-transporting layer has a function of improving emission efficiency of the organic electroluminescence element by improving efficiency of the injection. Each of the positive hole-transporting layer and the electron-transporting layer comprises an organic material. As is described above, the organic electroluminescence element generally comprises an organic material layer provided between the anode layer and the cathode layer. The organic material layer includes at least a light-emitting organic material layer.

The cathode layer of the organic electroluminescence element comprises an active metal material having a small work function (generally 4 eV or less) to inject an electron into the organic material layer effectively. Accordingly, the cathode layer tends to be degraded when the layer is brought into contact with moisture or oxygen. If moisture or oxygen in the air permeates into the organic electroluminescence element, the cathode layer may be degraded to cause some problems such as decrease of luminance of the light-emitting element, and separation between the cathode layer and the organic layer. The separated area cannot emit light in the light-emitting element.

A conventional electroluminescence element is placed in an airtight space shielded (sealed) from the outer air. The airtight space is enclosed with a glass substrate on which the light-emitting element is formed and glass plates fixed around the substrate with an adhesive impermeable to moisture (hereinafter referred to as sealing glass plates). A hygroscopic material layer has been proposed to be provided on an inner surface of the sealing glass plate to absorb moisture remaining in the space after sealing it.

Japanese Patent Provisional Publication No. 2000-260562 discloses a hygroscopic film comprising an alkaline earth metal oxide. The publication describes that the hygroscopic film provided on an inner side surface of a sealing glass plate can prevent moisture from permeating into an organic electroluminescence element.

Japanese Patent Provisional Publication No. 2003-144830 discloses a desiccating agent comprising an organic metal compound. The publication describes that a hygroscopic material layer provided on an inner side surface of a sealing glass plate can prevent moisture from permeating into an organic electroluminescence element. The hygroscopic material layer is formed by dissolving the desiccating agent in an organic solvent to prepare a solution, coating the solution on the inner side surface of the sealing glass plate, and drying it.

Japanese Patent Provisional Publication No. 2002-100469 discloses a method of preventing moisture from permeating into a light-emitting element. The method comprises for example, forming an organic electroluminescence element on a resin substrate provided that an inorganic barrier film is provided between the substrate and the element, and covering the surface with an inorganic passivation film. In more detail, a silicon nitride oxide membrane is used as the inorganic barrier film, and a silicon nitride membrane is used as the inorganic passivation film.

DISCLOSURE OF THE INVENTION

Problems to be Solved by the Invention

A method of attaching each one of sealing glass plates to an organic electroluminescence element to prevent moisture from permeating into a light-emitting element (described above) has a disadvantage of low productivity of the light-emitting element. A method of covering a surface of an organic electroluminescence element with an inorganic passivation film also has a disadvantage of low productivity of the light-emitting element because a thick inorganic passivation film should be used to obtain a low permeability to moisture analogous to the permeability of the sealing glass plate.

An object of the present invention is to provide an organic electroluminescence element preventing moisture from permeating into a light-emitting element, and an efficient process for preparation of the same.

Another object of the invention is to provide an electrode film that can be used to prepare efficiently an organic electroluminescence element preventing moisture from permeating into a light-emitting element.

The present invention provides an organic electroluminescence element comprising on a surface of a transparent substrate, a transparent electrode layer, an organic material layer including a light-emitting organic material layer, an opaque electrode layer, an insulating layer, a metal layer and a resin film in order.

The organic electroluminescence element having the above-described structure is hereinafter referred to as a first organic electroluminescence element. Preferred embodiments of the first organic electroluminescence element are described below.

(1) The metal layer has a thickness in the range of 10 to 500 nm.

(2) The insulating layer has a thickness in the range of 10 to 1,000 nm.

(3) Another metal layer is provided on a surface of the resin film.

(4) Another insulating layer and another metal layer are provided between the opaque electrode layer and the insulating layer. The other insulating layer and the other metal layer are arranged in order from the opaque electrode layer.

(5) The insulating layer comprises a hygroscopic material.

(6) A hygroscopic material layer is provided between the insulating layer and the metal layer.

(7) The hygroscopic material comprises an alkaline earth metal oxide.

The present invention also provides a process for preparation of an organic electroluminescence element comprising the steps of: preparing an electrode substrate and an electrode film, said electrode substrate comprising a transparent electrode layer on a surface of a transparent substrate, and said electrode film comprising on a surface of a resin film, a metal layer, an insulating layer and an opaque electrode layer in order, provided that an organic material layer including a light-emitting organic material layer is provided on a surface of at least one of the transparent electrode layer and the opaque electrode layer; placing the electrode film on the electrode substrate while placing the organic material layer between the transparent electrode layer and the opaque electrode layer; and pressing the electrode substrate and the electrode film while heating the organic material layer to soften the layer whereby causing the electrode film to adhere to the electrode substrate.

The above-described process for preparation of an organic electroluminescence element is hereinafter referred to as a first process for preparation. Preferred embodiments of the first process for preparation are described below.

(1) The metal layer has a thickness in the range of 10 to 500 nm.

(2) The insulating layer has a thickness in the range of 10 to 1,000 nm.

(3) Another metal layer is provided on a back surface of the resin film.

(4) Another metal layer and another insulating layer are provided between the insulating layer and the opaque electrode layer. The other metal layer and the other insulating layer are arranged in order from the insulating layer.

(5) The insulating layer comprises a hygroscopic material.

(6) A hygroscopic material layer is provided between the metal layer and the insulating layer.

(7) The hygroscopic material comprises an alkaline earth metal oxide.

The present invention further provides an electrode film comprising on a surface of a resin film, a metal layer, an insulating layer and an opaque electrode layer in order.

The electrode film having the above-described structure is hereinafter referred to as a first electrode film. Preferred embodiments of the first electrode film are described below.

(1) The metal layer has a thickness in the range of 10 to 500 nm.

(2) The insulating layer has a thickness in the range of 10 to 1,000 mm.

(3) Another metal layer is provided on a back surface of the resin film.

(4) Another metal layer and another insulating layer are provided between the insulating layer and the opaque electrode layer. The other metal layer and the other insulating layer are arranged in order from the insulating layer.

(5) The insulating layer comprising a hygroscopic material.

(6) A hygroscopic material layer is provided between the metal layer and the insulating layer.

(7) The hygroscopic material comprises an alkaline earth metal oxide.

The present invention furthermore provides a rolled electrode film obtained by winding the first electrode film in the form of a roll.

The rolled electrode film having the above-described structure is hereinafter referred to as a first rolled electrode film.

Moreover, the present invention provides an organic electroluminescence element comprising on a surface of a transparent substrate, a transparent electrode layer, an organic material layer including a light-emitting organic material layer, an opaque electrode layer, a resin film and a metal layer in order.

The organic electroluminescence element having the above-described structure is hereinafter referred to as a second organic electroluminescence element. Preferred embodiments of the second organic electroluminescence element are described below.

(1) The metal layer has a thickness in the range of 10 to 500 nm.

(2) An insulating hygroscopic material layer is provided between the opaque electrode layer and the resin film.

(3) An insulating layer and a hygroscopic material layer are provided between the opaque electrode layer and the resin film. The insulating layer and the hygroscopic material layer are arranged in order from the opaque electrode layer.

(4) The hygroscopic material comprises an alkaline earth metal oxide.

The present invention also provides a process for preparation of an organic electroluminescence element comprising the steps of: preparing an electrode substrate and an electrode film, said electrode substrate comprising a transparent electrode layer on a surface of a transparent substrate, and said electrode film comprising an opaque electrode layer on a surface of a resin film and a metal layer on a back surface of the resin film, provided that an organic material layer including a light-emitting organic material layer is provided on a surface of at least one of the transparent electrode layer and the opaque electrode layer; placing the electrode film on the electrode substrate while placing the organic material layer between the transparent electrode layer and the opaque electrode layer; and pressing the electrode substrate and the electrode film while heating the organic material layer to soften the layer whereby causing the electrode film to adhere to the electrode substrate.

The above-described process for preparation of an organic electroluminescence element is hereinafter referred to as a second process for preparation. Preferred embodiments of the second process for preparation are described below.

(1) The metal layer has a thickness in the range of 10 to 500 nm.

(2) An insulating hygroscopic material layer is provided between the resin film and the opaque electrode layer.

(3) A hygroscopic material layer and an insulating layer are provided between the resin film and the opaque electrode layer. The hygroscopic material layer and the insulating layer are arranged in order from the resin film.

(4) The hygroscopic material comprises an alkaline earth metal oxide.

The present invention further provides an electrode film comprises an opaque electrode layer on a surface of a resin film and a metal layer on a back surface of the resin film.

The electrode film having the above-described structure is hereinafter referred to as a second electrode film. Preferred embodiments of the second electrode film are described below.

(1) The metal layer has a thickness in the range of 10 to 500 nm.

(2) An insulating hygroscopic material layer is provided between the resin film and the opaque electrode layer.

(3) A hygroscopic material layer and an insulating layer are provided between the resin film and the opaque electrode layer. The hygroscopic material layer and the insulating layer are arranged in order from the resin film.

(4) The hygroscopic material comprises an alkaline earth metal oxide.

The present invention furthermore provides a rolled electrode film obtained by winding the second electrode film in the form of a roll.

The rolled electrode film having the above-described structure is hereinafter referred to as a second rolled electrode film.

In the present specification, the term "transparent" means that transmittance of visible light is 60% or more, and preferably is 70% or more. The term "opaque" means that transmittance of visible light is 30% or less, and preferably is 20% or less.

Effect of the Invention

The electrode film of the present invention has a basic structure comprising on a surface of a resin film, a metal layer, an insulating layer and an opaque electrode layer in order. In the electrode film of the invention, the metal layer prevents moisture form permeating from the resin film. Further, the electrode film can be wound in the form of a roll because the metal layer has excellent flexibility. An organic electroluminescence element improved in durability, which prevents moisture from permeating into a light-emitting element from an opaque electrode layer, can be efficiently produced using the electrode film or the rolled electrode film. The organic electroluminescence element can be further improved in durability by making an insulating layer from a hygroscopic material or providing a hygroscopic material layer between a metal layer and an insulating layer to absorb and remove moisture remaining in a light-emitting element with the hygroscopic material.

BEST MODE FOR CARRYING OUT THE INVENTION

The first organic electroluminescence (hereinafter referred to as EL) element of the present invention comprises on a surface of a transparent substrate, an organic material layer including a light-emitting organic material layer, an opaque electrode layer, an insulating layer, a metal layer and a resin film in order. The transparent electrode layer of the organic EL element generally is an anode (positive electrode) layer, and the opaque electrode layer generally is a cathode (negative electrode) layer. The present invention is described below by referring to an embodiment having a transparent anode layer and an opaque cathode layer.

FIG. 1 is a sectional view showing an example of structure of the first organic EL element. The first organic EL element 11 comprises on a surface of a transparent substrate 12, an anode (transparent electrode) layer 15, an organic material layer including a light-emitting organic material layer, a cathode (opaque electrode) layer 25, an insulating layer 24, a metal layer 23 and a resin film 22 in order. The organic material layer of the organic EL element comprises a positive hole-transporting layer 16 and a light-emitting organic material layer 17. The light given in the light-emitting organic material layer 17 is taken out of the light-emitting element through the transparent substrate 12. An arrow 10 shown in FIG. 1 indicates a direction to take out the light.

A substrate having a low permeability to moisture is used as the transparent substrate 12. Examples of the transparent substrate 12 include a ceramic substrate such as a glass substrate, and a resin substrate (or a resin film) having been subjected to a moisture-proofing treatment. Examples of the moisture-proofing treatment for the resin substrate include a process of forming a membrane of low permeability to moisture on a surface of the resin film. Examples of the membrane of low permeability to moisture include a silicon oxide membrane, a silicon nitride membrane, a silicon nitride oxide membrane and a metal membrane. In the case that the metal membrane is used, the thickness of the membrane should be so controlled that the membrane can transmit visible light to take out light given in a light-emitting organic material layer from the light-emitting element. Therefore, the metal membrane used as the membrane of low permeability to moisture preferably has a thickness of not more than several ten nanometers.

The periphery of the organic EL element 11 is subjected to a moisture-proofing treatment to prevent moisture from permeating into a light-emitting element from the periphery. Examples of the moisture-proofing treatment include a process of forming a resin layer of low permeability to moisture on the periphery of the organic EL element. The resin layer of low permeability to moisture can be formed by coating a resin that can be hardened at room temperature or by irradiating with ultraviolet ray on the periphery of the light-emitting element, and hardening the resin. Examples of the resins include an epoxy resin and an acrylic resin. The resin for the moisture-proofing treatment can be the same as the resin contained in an adhesive used to attach the sealing glass plates to the substrate of the conventional organic EL element (described above).

The organic EL element 11 is characterized in that an insulating layer 24, a metal layer 23 and a resin film 22 are provided on the surface of the cathode layer 25. The insulating layer 24 intervenes between the surface of the cathode layer 25 and the metal layer 23. The metal layer comprises a metal material, and has low permeability to moisture. The metal layer 23 is provided on a surface through which light given in the light-emitting organic material layer 17 of the organic EL element 11 is not taken out. In other words, the metal layer 23 is provided outside of the cathode layer 25 that should not transmit the light. The metal layer 23 can prevents moisture from permeating into the light-emitting element from the cathode layer 25. Another metal layer different from the above-described metal layer 23 can be formed on a surface of the resin film 22 (a surface other than the surface on which the metal layer 23 is provided) to prevent moisture from permeating into the light-emitting element from the cathode layer 25.

An electrode film used in preparation of the organic EL element shown in FIG. 1 is described below.

FIG. 2 is a sectional view showing an example of structure of the first electrode film, which is used in preparation of the organic EL element shown in FIG. 1. The first electrode film 21 comprises on a surface of a resin film 22, a metal layer 23, an insulating layer 24 and a cathode (opaque electrode) layer 25 in order.

Examples of the resin film 22 include a polyester film (e.g., polyethylene terephthalate film), a polycarbonate film, a polyimide film, a polyether sulfone film, a polyether imide film, a polyphenylene sulfide film, a polysulfone film, a polyether ether ketone film, a polyamide film, a polymethyl methacrylate film, a polyethylene naphthalate film, a polyarylate film and a cycloolefin polymer film.

The resin film 22 has a thickness preferably in the range of 3 to 1,000 μm, more preferably in the range of the 10 to 500 μm, and most preferably in the range of 10 to 300 μm.

The metal layer 23 comprises a metal material. The metal material has low permeability to moisture and excellent flexibility. In the first electrode film 22, the metal layer 23 prevents moisture from permeating through the resin film 22. The electrode film 21 can be wound up in the form of a roll because the metal layer 23 is flexible. Another metal layer different from the metal layer 23 can be provided on a back surface of the resin film (a surface other than the surface on which the metal layer 23 is provided) to further prevent moisture from permeating through the resin film 22.

Examples of the metal material for the metal layer 23 include gold, silver, copper, aluminum, titanium, palladium, platinum and an alloy comprising at least one of the above-mentioned metal materials.

Examples of a method for forming the metal layer 23 include a dry forming method such as a vacuum deposition method or a sputtering method and a wet forming method such as a gravure printing method or a blade coating method.

The metal layer 23 has a thickness preferably in the range of 5 to 500 nm, and more preferably in the range of 10 to 500 nm. The thickness is so adjusted that a crack cannot be formed while winding the electrode film 21 in the form of a roll.

The insulating layer provided between the metal layer 23 and the cathode layer 25 prevents electrical connection between the metal layer and the cathode layer. In the case that two or more cathode layers (for example, stripes of the cathode layer) are formed on a surface of the insulating layer, the insulating layer prevents short-circulating caused by electrical connection between the cathode layers though the metal layer 23.

The material for the insulating layer can be a known insulating material. Examples of the insulating material include a metal oxide material such as $TiO_2$, $Al_2O_3$, $Nb_2O_5$, $Ta_2O_5$, $SiO_2$ or $Si_3N_4$, and a resin material that can be hardened at room temperature, by heat or by light (preferably ultraviolet lay) irradiation. Examples of the resin material include an epoxy resin and an acrylic resin.

Examples of a method for forming the insulating layer 24 include a dry forming method such as a vacuum deposition method or a sputtering method and a wet forming method such as a screen printing method, a gravure printing method or an ink-jetting method.

The insulating layer 24 has a thickness preferably in the range of 10 to 1,000 nm. The thickness of the insulating layer is so adjusted according to the hardness of the material of the insulating layer that a crack cannot be formed while winding the electrode film 21 in the form of a roll. The thickness of the insulating layer is more preferably in the range of 10 to 500 nm, further preferably in the range of 10 to 180 nm, and most preferably in the range of 10 to 150 nm.

The material and thickness of the cathode layer are the same as those of the conventional organic EL element. The material and thickness are described later.

An adhesive layer can be provided between the resin film 22 and the metal layer 23 to improve adhesion between them. The insulating material for forming the insulating layer 24 can be used as the material for forming the adhesive layer. The preferred range of the thickness of the adhesive layer is the same as that of the insulating layer 24.

FIG. 3 is a sectional view showing another example of structure of the first electrode film of the present invention. The structure of the electrode film 31 shown in FIG. 3 is the same as that of the electrode film 21 shown in FIG. 2, except that another metal layer 33 and another insulating layer 34 are provided between the insulating layer 24 and the cathode (opaque electrode) layer 25. The other metal layer 33 and the other insulating layer 34 are arranged in order from the insulating layer 24. As is shown in FIG. 3, the two metal layers 23, 24 provided in the electrode film 31 prevent moisture or oxygen from permeating into the organic EL element.

FIG. 9 is a sectional view showing a further example of structure of the first electrode film of the present invention. The electrode film 91 shown in FIG. 9 comprises on a surface of a resin film 22, a metal layer 23, a hygroscopic material layer 29, an insulating layer 24 and a cathode layer 25 in order. The structure of the electrode film 91 is the same as that of the electrode film 21 shown in FIG. 2, except that the hygroscopic material layer 29 is provided between the metal layer 23 and the insulating layer 24.

The known hygroscopic material that can be molded into a layer can be used as a material for the hygroscopic material layer 29. Representative examples of the hygroscopic material include oxides of alkaline earth metal (Ca, Sr, Ba, Ra, Be, Mg) disclosed in Japanese Patent Provisional Publication No. 2000-260562 and organic metal compounds such as aluminum oxide octylate disclosed in Japanese Patent Provisional Publication No. 2003-144830.

Examples of the method of forming the hygroscopic material layer 29 from an alkaline earth metal oxide include an electron beam deposition method and a sputtering method. The sputtering method preferably uses a target made of an alkaline earth metal peroxide. The hygroscopic material layer preferably is a strontium oxide (SrO) layer made by a sputtering method using strontium peroxide ($SrO_2$) as a target.

Examples of the method of forming the hygroscopic material layer 29 from an organic metal compound include a method of coating or printing with a solution in which the organic metal compound such as an aluminum oxide octylate is dissolved in an organic solvent such as toluene or xylene.

Another hygroscopic material is a mixture of a desiccating agent with a resin material.

For example, Japanese Patent Provisional Publication No. 2001-345175 discloses a process for preparation of an organic EL element comprising coating a surface of a sealing glass plate with a mixture of a solid powder desiccating agent with a resin material to form a layer and using the sealing glass plate having the mixture layer. The publication further describes a process of mixing and dispersing powder of BaO (desiccating agent) in a liquid silicone rubber that can be hardened, and coating a sealing glass plate with the dispersion according to a doctor blade method.

Japanese Patent Provisional Publication No. 2001-57287 discloses an organic EL element in which a sealing glass plate has a layer of a mixture of a desiccating agent with a resin material. The publication further describes a process of coating a sealing glass plate with a mixture of $CaH_2$ (desiccating agent) with a liquid silicone rubber that can be hardened to form the mixture layer.

The electrode film of the present invention can be prepared by forming on a surface of a metal layer formed on a resin film, for example, a hygroscopic material layer comprising a mixture of a desiccating agent with a resin material in the same manner as in the above-described publications, and then forming an insulating layer and a cathode layer.

The hygroscopic material layer 29 has a thickness preferably of 100 μm or less, and more preferably in the range of 0.1 to 30 μm.

An organic EL element prepared using an electrode film 91 having a hygroscopic material layer 29 has an excellent durability, since a metal layer 23 prevents moisture from permeating into a light-emitting element through a resin film 22, and a hygroscopic material layer 29 absorbs moisture remaining in the light-emitting element after an electrode film adheres to an electrode substrate. A light-emitting element can be prepared efficiently using the electrode film having the hygroscopic material layer, while the conventional organic EL element has been prepared by forming a hygroscopic material layer on a sealing glass plate and sealing each one of the elements with the plate.

In the case that the hygroscopic material is an insulating material, the insulating layer can be made of the insulating hygroscopic material without providing the hygroscopic material layer 29 in the electrode film 91. Examples of the insulating hygroscopic material include the alkaline earth metal oxide described in Japanese Patent Provisional Publication No. 2000-260562 and the organic metal compounds disclosed in Japanese Patent Provisional Publication No. 2003-144830.

In the case that the insulating layer 24 is made of an insulating hygroscopic material, the insulating layer 24 has a thickness preferably of 100 μm or less, and more preferably in the range of 0.1 to 30 μm.

FIG. 4 shows an example of structure of the first rolled electrode film of the present invention. The rolled electrode film 20 shown in FIG. 4 is obtained by winding up the electrode film 21 in the form of a roll. The electrode film 21 comprises on a surface of a resin film 22, a metal layer 23, an insulating layer 24 and stripes of a cathode layer 25 in order. The cathode layer 25 is prevented from being in contact with the air by winding up the electrode film 21 in the form of a roll to inhibit deterioration of the cathode layer 25.

The rolled electrode film 20 is prepared by winding up the electrode film 21 in the form of a roll preferably under reduced pressure or in an atmosphere of an inactive gas (e.g., nitrogen gas) to inhibit deterioration of the cathode layer 25. The rolled electrode film 20 as a whole is wrapped under reduced pressure or packaged while packing an inactive gas.

As is shown in FIG. 4, a metal layer 23 is preferably provided on a surface of a resin film 22 at the most outer roll of a rolled electrode film 20. In the rolled electrode film 20 shown in FIG. 4, the most outer roll is covered with the metal layer 23 after the film is wound up as a whole. Therefore, the metal layer 23 prevents moisture form permeating the rolled electrode film 20 through the most outer roll to inhibit deterioration of the cathode layer more effectively by covering the most outer roll (e.g., the last one roll) of the rolled film with the metal layer 23. At two or more outer rolls of the rolled electrode film 20, the metal layer can be provided on the surface of the resin film.

The electrode film is preferably wound up with a tension of $2.5 \times 10^5$ to $4.0 \times 10^7$ N/m$^2$ to prevent moisture from permeating into the rolled electrode film 20 through the sides of the roll. The neighboring electrode films adhere to each other to prevent moisture from permeating into the rolled electrode film through the sides of the roll more effectively after the film is wound up while applying the tension to the film.

The electrode film 21 is preferably wound up around a core tube (made of paper, a resin or a metal) to form a roll. The core tube is preferably made of a metal, or a surface of the core tube is preferably covered with a metal film to prevent moisture from permeating the rolled electrode film through the core tube. The core tube has a diameter preferably in the range of 30 to 300 mm, more preferably in the range of 50 to 200 mm, and most preferably in the range of 70 to 175 mm.

A process for preparation of an organic EL element using the first electrode film is described below. The organic EL element is prepared by placing the first electrode film on an electrode substrate comprising on a surface of a transparent substrate, a transparent anode layer and an organic material layer including a light-emitting organic material layer in order while placing the organic material layer between the cathode layer and the anode layer, and causing to adhere them to each other.

FIG. 5 shows an example of a process for preparation of an organic EL element of the present invention (first process for preparation). In the first process for preparation shown in FIG. 5, an electrode substrate 51 comprising on a surface of a glass substrate (transparent substrate) 52, an anode (transparent electrode) layer 55 and an organic material layer 56 in order is first prepared. The rolled electrode film 20 shown in FIG. 4 is also prepared. In FIG. 5, the metal layer and the insulating layer are omitted from the rolled electrode film 20.

The electrode substrate 51 is provided on a surface of the substrate-transporting film 50. A laminate of the electrode substrate 51 and the electrode film 21 passes between a pair of heating rolls 57a, 57b while placing the organic material layer 56 between the anode layer 55 and the cathode layer 25. The laminate of the electrode substrate 51 and the electrode film is pressed and heated on the heating rolls 57a, 57b. The organic material layer 56 is heated to become soft so that the electrode film 21 becomes to adhere to the electrode substrate 51. As a result, an organic EL element 58 is prepared. The organic EL element, in which moisture is prevented from permeating into the light-emitting element, can be prepared successively and effectively using the rolled electrode film 20 without use of the conventional sealing glass plates. The successively prepared two or more organic EL elements are cut into pieces with respect to one of the light-emitting element. The periphery of the element is subjected to a moisture-proofing treatment as is described above.

FIG. 6 shows another example of a process for preparation of an organic EL element of the present invention (first process for preparation). In the process for preparation shown in FIG. 6, a rolled electrode substrate 60 and the rolled electrode film 20 shown in FIG. 4 are first prepared. The rolled electrode substrate 60 is obtained by winding up an electrode substrate 61 comprising on a surface of a transparent film (transparent substrate) 62, a transparent electrode layer 65 and an organic material layer 66 in order. In FIG. 6, the metal layer and the insulating layer are omitted from the rolled electrode film 20.

A resin film having a membrane of low permeability to moisture (described above) can be used as the transparent film 62 of the electrode substrate 61.

A laminate of an electrode substrate 61 and an electrode film 21 passes between a pair of heating rolls 57a, 57b while placing the organic material layer 66 between the anode layer 65 and the cathode layer 25. The laminate of the electrode substrate 61 and the electrode film is pressed and heated on the heating rolls 57a, 57b. The organic material layer 66 is heated to become soft so that the electrode film 21 becomes to adhere to the electrode substrate 61. As a result, an organic EL element 58 is prepared. The successively prepared two or more organic EL elements are cut into pieces with respect to one of the light-emitting element. The periphery of the element is subjected to a moisture-proofing treatment.

A second organic EL element of the present invention is described below. The second organic EL element comprises on a surface of a transparent substrate, a transparent electrode layer, an organic material layer including a light-emitting organic material layer, an opaque electrode layer, a resin film and a metal layer in order. The second organic EL element is described below by referring to an embodiment having a transparent anode layer and an opaque cathode layer.

FIG. 7 is a sectional view showing an example of structure of the second organic EL element. The second organic EL element 71 comprises on a surface of a transparent substrate, an anode (transparent electrode) layer 15, an organic material layer including a light-emitting organic material layer, a cathode (opaque electrode) layer 25, a resin film 22 and a metal layer 23 in order. The organic material layer of the organic EL element 71 comprises a positive hole-transporting layer 16 and a light-emitting organic material layer 17.

The structure of the organic EL element shown in FIG. 7 is the same as that of the organic EL element shown in FIG. 1, except that the metal layer 23, which prevents moisture from permeating into the light-emitting element through the resin film 22, is provided on a surface (reverse to the surface on which the anode layer 25 is provided) of the resin film. In the structure of the organic EL element shown in FIG. 7, the resin film 22 electrically insulates the metal layer 23 form the cathode layer 25. Accordingly, an insulating layer is not necessary.

In the organic EL element 71, the metal layer is provided on the resin film to prevent moisture form permeating into the light-emitting element through the cathode 25. The metal layer is provided on a surface through which light given in the light-emitting organic material layer of the light-emitting element is not taken out, in other words, on a surface that does not need transmittance to light.

FIG. 8 is a sectional view showing an example of structure of the second electrode film, which is used in preparation of the organic EL element shown in FIG. 7. The electrode film 81 comprises a cathode (opaque electrode) layer on a surface of a resin film 22 and a metal layer 23 on a back surface of the resin film. A second rolled electrode film can be obtained by winding up the second electrode film 81.

A process for preparation of an organic EL element using the second electrode film (second process for preparation) is described below. The organic EL element can be prepared, for example by placing the second electrode film on an electrode substrate comprising on a surface of a transparent substrate, an anode (transparent electrode) layer and an organic material layer including a light-emitting organic material layer in order while placing the organic material layer between the anode layer and the cathode layer, and causing adhesion of the electrode film to the electrode substrate. The second process for preparation can be conducted in the same manner as in the first process for preparation, except for use of the second electrode film. An organic EL element, in which moisture is prevented from permeating into the light-emitting element, can be successively and effectively prepared according to the second process in the same manner as in the first process.

FIG. 10 is a sectional view showing another example of structure of the second electrode film of the present invention. The electrode film 101 shown in FIG. 10 comprises on a surface of a resin film 22, a hygroscopic material layer 29, an insulating layer 24 and a cathode layer 25 in order and a metal layer on a back surface of the resin film. The structure of the resin film 101 is the same as that of the electrode film 81 shown in FIG. 8, except that the hygroscopic material layer 29 and the insulating layer 24 are provided between the resin film 22 and the opaque electrode layer 25. The hygroscopic material layer 29 and the insulating layer 24 are arranged in order from the resin film. The material and the process for preparation of the hygroscopic material layer 29 of the electrode film shown in FIG. 10 is the same as those of the electrode film 81 shown in FIG. 8.

The organic EL element prepared using the electrode film 101 having the hygroscopic material layer 29 shown in FIG. 10 has an improved durability in the same as the element prepared using the electrode film 91 shown in FIG. 9. In the organic EL element, the metal layer 23 prevents moisture from permeating into the light-emitting element through the resin film 22. Further, the hygroscopic material layer 29 absorbs moisture remaining in the light-emitting element after the electrode film is caused to adhere to the electrode substrate. Therefore, the deterioration of the cathode layer 25 is effectively inhibited to improve the durability. The organic EL element can be prepared efficiently using the electrode film having the hygroscopic material layer.

The insulating layer 24 can be made of a hygroscopic material layer in place of forming the hygroscopic material layer 29 of the electrode film 101 shown in FIG. 10, as is described about the electrode film 91 shown in FIG. 9.

The layered structure and the materials of the anode layer, the organic material layer and the cathode layer in the organic EL element of the present invention are described below. The anode layer, the organic material layer and the cathode layer can be prepared in the same manner as in the known organic EL element.

The organic material layer of the organic EL element comprises one layer or two or more layers including at least one light-emitting organic material layer. As is described above, a positive hole-transporting layer can be provided between the light-emitting organic material layer and the anode layer to improve the light-emitting efficiency of the organic EL element. An electron-transporting layer can also be provided between the organic material layer and the cathode layer to improve the light-emitting efficiency. Examples of the layered structure of the organic EL element of the present invention are described below.

Examples of the layered structure of the first organic EL element are shown below.
(a) Transparent substrate/anode layer/light-emitting organic material layer/cathode layer/insulating layer/metal layer/resin film
(b) Transparent substrate/anode layer/positive hole-transporting layer/light-emitting organic material layer/cathode layer/insulating layer/metal layer/resin film
(c) Transparent substrate/anode layer/light-emitting organic material layer/electron-transporting layer/cathode layer/insulating layer/metal layer/resin film
(d) Transparent substrate/anode layer/positive hole-transporting layer/light-emitting organic material layer/electron-transporting layer/cathode layer/insulating layer/metal layer/resin film Examples of the layered structure of the second organic EL element are shown below.
(a) Transparent substrate/anode layer/light-emitting organic material layer/cathode layer/resin film/metal layer
(b) Transparent substrate/anode layer/positive hole-transporting layer/light-emitting organic material layer/cathode layer/resin film/metal layer
(c) Transparent substrate/anode layer/light-emitting organic material layer/electron-transporting layer/cathode layer/resin film/metal layer
(d) Transparent substrate/anode layer/positive hole-transporting layer/light-emitting organic material layer/electron-transporting layer/cathode layer/resin film/metal layer Various layers (such as a positive hole-injection layer, which can be provided between the anode layer and the organic material layer, or an electron-injection layer, which can be provided between the cathode layer and the organic material layer) in addition to the positive hole-transporting layer and the electron-transporting layer can be provided between the anode layer and the cathode layer in the organic EL element to improve the light-emitting characteristics of the light-emitting element or the like. The materials for forming the layers are described later in more detail.

In the preparation of the organic EL element of the present invention by attaching an electrode film having an cathode electrode layer to an electrode substrate having an anode electrode layer, an organic material layer including a light-emitting organic material layer can be provided on a surface of the anode layer, or on a surface of the cathode layer. Further, the organic material layer can be divided into two layers along an interface parallel to the surface plane of the layer. One of the divided two layers can be provided on a surface of the anode layer while placing a surface caused by the division as the uppermost surface, and the other layer can be provided on a surface of the cathode layer while placing a surface caused by the division as the uppermost surface. The organic material layer can be divided along the interface between the layers. The organic material layer can also be divided along a plane parallel to the surface plane of the layer with a certain space along a thickness direction (for example, the light-sensitive organic material layer can be divided along a plane parallel to the surface plane in the case of the above-mentioned layered structure (a)).

The organic material layer provided on a surface of at least one of the anode layer and the cathode layer is heated to be soft while adhering the electrode film to the electrode plate. If the heating temperature is extremely high, the thickness of the softened layer varies much while attaching the electrode film to the electrode plate. If the heating temperature is extremely low, it is difficult to adhere tightly the electrode plate and the electrode film to each other. The temperature for heating the organic material layer is preferably in the range of ±25° C. of the glass transition temperature (Tg) of the layer to be softened (Tg±25° C.), and more preferably in the range of ±20° C. of the grass transition temperature (Tg±20° C.).

The anode layer comprises a metal having a large work function (4 eV or more), an electroconductive compound or a mixture thereof. Examples of the material for the anode layer include ITO (indium oxide doped with tin) and IZO (indium zinc oxide).

The anode layer has a thickness generally of 1 µm or less, and preferably of 200 nm or less. The anode layer has a resistance preferably of less than several hundreds Ω per square. Examples of a method for forming the anode layer include a vacuum deposition method, a direct current (DC) sputtering method, a radiofrequency (RF) sputtering method, a spin coating method, a casting method, an LB method, a pyrosol method and a spraying method.

Examples of a material for the positive hole-transporting layer include a tetraarylbenzidine compound, an aromatic amine, a pyrazolone derivative and a triphenylene derivative.

The positive hole-transporting layer has a thickness preferably in the range of 2 to 200 nm. Examples of a method for forming the positive-hole transporting layer include a vacuum deposition method, a spin coating method, a casting method, an LB method and a printing method.

An electron accepter can be added to the positive hole-transporting layer to improve mobility of the positive hole. Examples of the electron accepter include a metal halide, a Lewis acid and an organic acid. It has already been known to add the electron accepter to the positive hole-transporting layer.

The light-emitting organic material layer can be made of a light-emitting organic material or a carrier-transporting (positive hole-transporting, electron-transporting or ampho-teric transporting) organic material (hereinafter referred to as a host material) to which a small amount of a light-emitting organic material is added. The emitted color of the organic EL element can be easily determined by selecting the light-emitting organic material used in the light emitting organic material layer.

In the case that the light-emitting organic material layer is made of a light-emitting organic material, the light-emitting organic material preferably shows excellent film forming property, and the formed layer is preferably stable. Examples of the light-emitting organic material layer include a metal complex such as $Alq_3$ (tris-(8-hydroxyquinolinato)aluminum, a polyphenylene vinylene (PVV) derivative and a polyfluorene derivative. A small amount of the light-emitting organic material is used with the host material. Accordingly, another light-emitting organic material such as a fluorescent dye, which itself hardly forms a stable thin layer, can be used with the host material. Examples of the fluorescent dye include coumarin, a DCM derivative, quinacridone, perylene and rubrene. Examples of the host material include the above-mentioned $Alq_3$, TPD (triphenyldiamine), an electron-transporting oxadiazole derivative (PBD), a polycarbonate copolymer and a polyvinyl carbazole. In the case that the light-emitting organic material layer is made of an light emitting organic material, a small amount of another light-emitting organic material such as the fluorescent dye can be added to the layer to adjust the color of the emitted light.

The light-emitting organic layer has a thickness preferably of 200 nm or less to emit practical luminance of light. The light-emitting organic material layer can be formed according to the same method as in the formation of the positive hole-transporting layer.

Examples of the material for the electron-transporting layer are electron-transporting materials including heterocyclic tetracarboxylic anydrides such as a nitrofluorene derivative, a diphenylquinone derivative, a thiopyran dioxide derivative, a naphthalene pirylene derivative, carbodiimide, fluorenylidene methane derivatives, anthraquinone dimethanes, anthrone derivatives, oxadiazole derivatives, quinoline derivatives, quinoxaline derivatives, perylene derivatives, pyridine derivatives, pyrimidine derivatives and stilbene derivatives. An aluminum quinolinol complex such as tris-(8-hydroxyquinoline)aluminum (Alq) can also be used as the electron-transporting material.

The electron-transporting material layer has a thickness preferably in the range of 5 to 300 nm. The electron-transporting layer can be formed in the same manner as in the formation of the positive-hole transporting layer.

The cathode layer can be formed of a metal having a small work function (4 eV or less), an alloy composition, an electroconductive compound or a mixture thereof. Examples of the material for the cathode layer include a metal such as Al, Ti, In, Na, K, Mg, Li, Cs, Rb, a rare earth metal and an ally composition such as Na—K alloy, Mg—Ag alloy, Mg—Cu alloy, Al—Li alloy.

The cathode layer has a thickness generally of 1 µm or less, and preferably of 200 nm or less. The cathode layer has a resistance preferably of less than several hundreds Ω per square. The cathode layer can be formed in the same manner as in the formation of the anode layer.

A positive hole-injecting layer can be provided between the anode layer and the organic material layer. An electron-injecting layer can also be provided between the cathode layer and the organic material layer. The injecting layers have a function of injecting many charges (positive holes or electrons) from the electrode layer to the organic material layer.

The injecting layer has other functions of smoothing a rough surface of the electrode layer or of lowering the driving voltage of the organic EL element.

A representative example of the material for the positive hole-injecting layer is a copper phthalocyanine (CuPc), and a representative example of the material for the electron-injecting layer is an alkali metal compound such as LiF (lithium fluoride). The positive hole-injecting layer is also referred to as an anode buffer layer, and the electron-injecting layer is also referred to as a cathode buffer layer.

EXAMPLE 1

A rolled PET film (film width: 25 cm, thickness: 0.1 mm) was run on a rotating drive reel for winding a roll. A thin silver film (metal layer, thickness: 100 nm), and then a thin titanium dioxide film (insulating layer, thickness: 20 nm) were formed on a surface of the running PET film using a magnetron sputtering apparatus.

The thin silver film was formed using silver as the sputtering target, and argon gas as the sputtering gas. The thin titanium dioxide film was formed using titanium as the sputtering target, and a mixed gas of argon and oxygen was used as the sputtering gas.

The running of the film was stopped, and a metal mask was placed on the surface of the thin titanium dioxide film. A thin (thickness: 200 nm) Mg—Ag alloy film was formed using a magnetron sputtering apparatus. The thin Mg—Ag alloy film was formed using the Mg—Ag alloy as the sputtering target, and argon gas as the sputtering gas. The metal mask was removed form the formed strips of the thin Mg—Ag film (cathode layer), which was elongatable along the longitudinal direction of the film. An electrode film was thus prepared.

The prepared electrode film was wound up on a rotating reel while applying thereto a tension of $1.37 \times 10^6$ N/m$^2$ under reduced pressure to prepare a rolled electrode film. The prepared film had such a structure that a metal layer was arranged on the surface of the PET film at the outermost roll of the rolled electrode film. The structure prevents moisture from permeating through the surface of the outermost roll of the rolled electrode film.

EXAMPLE 2

A glass plate, on which stripes of ITO film (transparent anode layer) were formed, was washed. A surface of the ITO film was coated with a coating solution for forming a positive hole-transporting layer (an aqueous solution of PEDOT/PSS, available from Bayer AG Lever-lusen) using a spin coater at 3,500 rpm for 30 seconds. The coated film was dried in an oven under reduced pressure at 130° C. for 1 hour to form a positive hole-transporting layer having the thickness of 50 nm.

A light-emitting organic material layer (Green K, available from American Dye Source) was dissolved in xylene to prepare a 1.5 wt. % solution as the coating solution for forming a light-emitting organic material layer. A surface of the positive hole-transporting layer was coated with the prepared coating solution for forming the light-emitting organic material layer using a spin coater in the same manner as in the formation of the positive hole-transporting layer to form a light-emitting organic material layer having the thickness of 50 nm.

The electrode film prepared in Example 1 was placed on the substrate on which the light-emitting organic material layer was formed (electrode substrate) while placing the organic material layers (the positive hole-transporting layer and the light-emitting organic material layer) between the anode layer and the cathode layer. The electrode layers were so arranged that strips of the electrode layers would be crossed to each other. The laminated glass plate and the electrode film passed through two heating rolls heated at the predetermined temperature of 140° C. to soften the light-emitting organic material layer. The plate and the film were combined to each other to prepare an organic electroluminescence element.

EXAMPLE 3

A rolled PET film was run on a rotating drive reel for winding a roll. A thin titanium dioxide film (thickness: 30 nm), a thin silver film (metal layer, thickness: 20 nm), and then a thin titanium dioxide film (insulating layer, thickness: 30 nm) were formed on a surface of the running PET film using a magnetron sputtering apparatus in the same manner as in Example 1.

The running of the film was stopped, and a metal mask was placed on the surface of the thin titanium dioxide film. A thin (thickness: 160 nm) ITO film was formed using a magnetron sputtering apparatus. The thin ITO film was formed using ITO as the sputtering target, and a mixed gas of argon and oxygen as the sputtering gas. The metal mask was removed form the formed strips of the thin ITO film (transparent anode layer), which was elongatable along the longitudinal direction of the film.

A surface of the thin ITO film was coated with the coating solution for forming the positive hole-transporting layer used in Example 2 according to a micro gravure coating method. The coated film was dried to form a positive hole-transporting layer having the thickness of 50 nm. A surface of the positive hole-transporting layer was coated with the coating solution for forming the light-emitting organic material layer used in Example 2 according to the micro gravure coating method described above. The coated film was dried to form a light-emitting organic material layer having the thickness of 50 nm. An electrode substrate was thus prepared.

The prepared electrode substrate was wound up in the same manner as in the preparation of the electrode film of Example 1 to prepare a rolled electrode substrate. The rolled electrode substrate had such a structure that the metal layer was placed on the surface of the metal film at the outermost roll. The structure prevents moisture from permeating through the outer surface of the rolled electrode substrate.

The electrode film prepared in Example 1 was placed on the prepared electrode substrate while placing the organic material layer (the positive hole-transporting layer and the light-emitting organic material layer) between the anode layer and the cathode layer. The electrode layers were so arranged that strips of the electrode layers would be crossed to each other. The laminated glass electrode plate and the electrode film passed through two heating rolls heated at the predetermined temperature of 140° C. to soften the light-emitting organic material layer. The plate and the film were combined to each other to prepare an organic electroluminescence element.

EXAMPLE 4

A rolled PET film was run on a rotating drive reel for winding a roll. A thin silver film (metal layer, thickness: 100 nm), a thin strontium oxide (SrO) layer (hygroscopic material layer, thickness: 1 μm), and then a thin titanium dioxide film (insulating layer, thickness: 20 nm) were formed on a surface of the running PET film using a magnetron sputtering apparatus in the same manner as in Example 1.

The thin strontium oxide film was formed using sintered strontium peroxide ($SrO_2$) powder as the sputtering target, and argon gas as the sputtering gas.

Stripes of a thin Mg—Ag film (anode layer, thickness: 200 nm) were formed on the thin titanium dioxide layer in the same manner as in Example 1 to form an electrode film. The formed electrode film was wound up in the same manner as in Example 1 to prepare a rolled electrode film.

The electrode film adhered to an electrode substrate in the same manner as in Example 2, except that the prepared rolled electrode film was used.

EXAMPLE 5

A rolled PET film was run on a rotating drive reel for winding a roll. A thin (thickness: 100 nm) silver film (metal layer) was formed on a surface of the running PET film using a magnetron sputtering apparatus in the same manner as in Example 1. The film was wound up to prepare a rolled film.

The prepared rolled film was placed on an unwinding tool in a dry box. The film was coated with a 48 wt. % xylene solution of the aluminum oxide octylate having the chemical formula shown below according to a micro gravure method while winding up the film with a winding tool. The solution was dried to form a hygroscopic material layer having the thickness of 30 μm. The film was wound up on the winding tool to form a rolled film.

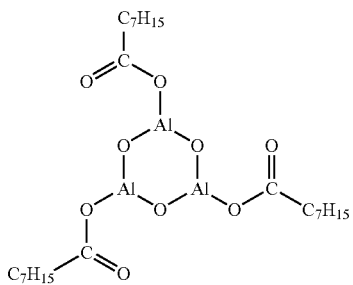

The rolled film having the hygroscopic material layer was run on a rotating drive reel for winding a roll. A thin titanium dioxide film (insulating layer, thickness: 20 nm) was formed on a surface of the hygroscopic material layer of the running film using a magnetron sputtering apparatus. Strips of a thin Mg—Ag film (cathode layer, thickness: 200 nm) were formed through a metal mask to prepare an electrode film. The thin Mg—Ag film was able to be elongated along the longitudinal direction of the film. The prepared electrode film was wound up in the same manner as in Example 1 to prepare a rolled electrode film.

The electrode film was caused to adhere to an electrode substrate in the same manner as in Example 2 to prepare an organic electroluminescence element, except that the prepared rolled electrode film was used.

EXAMPLE 6

A thin silver film (metal layer) was formed on a surface of a PET film using a magnetron sputtering apparatus in the same manner as in Example 1. The film having the thin silver film was taken out from the magnetron sputtering apparatus, and a surface of the silver layer was coated with a solution containing a thermosetting acrylic resin according to a micro gravure method. The solution was dried, and heated to harden the resin. A hardened resin layer (insulating layer) having the thickness of 500 nm was formed. Stripes of a Mg—Ag thin film were formed on a surface of the insulating layer in the same manner as in Example 1 to prepare an electrode film. The electrode film was caused to adhere to an electrode substrate in the same manner as in Example 2 to prepare an organic electroluminescence element, except that the prepared electrode film was used.

DESCRIPTION OF THE MARKS

Figure 1:
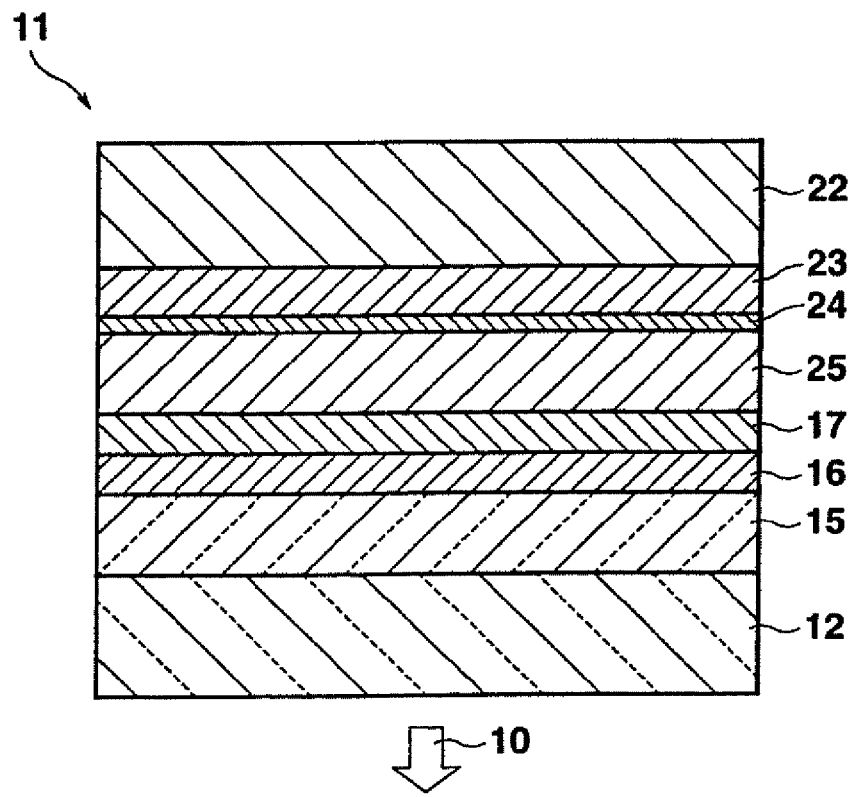
FIG. 1 is a sectional view showing an example of structure of a first organic electroluminescence element of the present invention.
Figure 2:
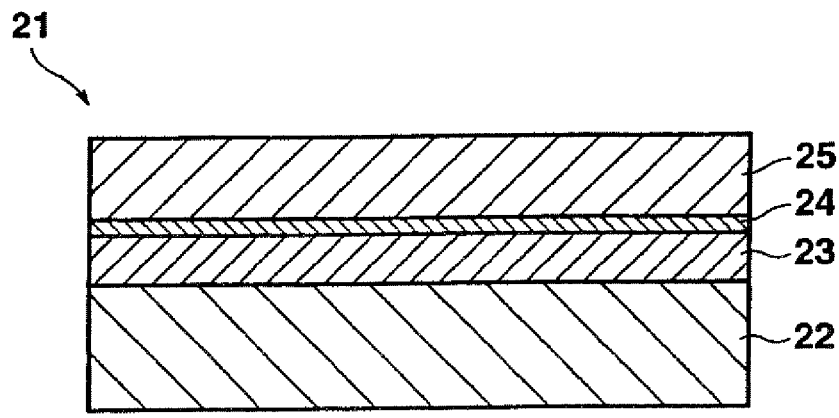
FIG. 2 is a sectional view showing an example of structure of a first electrode film of the present invention, which is used in preparation of the organic electroluminescence element shown in FIG. 1.
Figure 3:
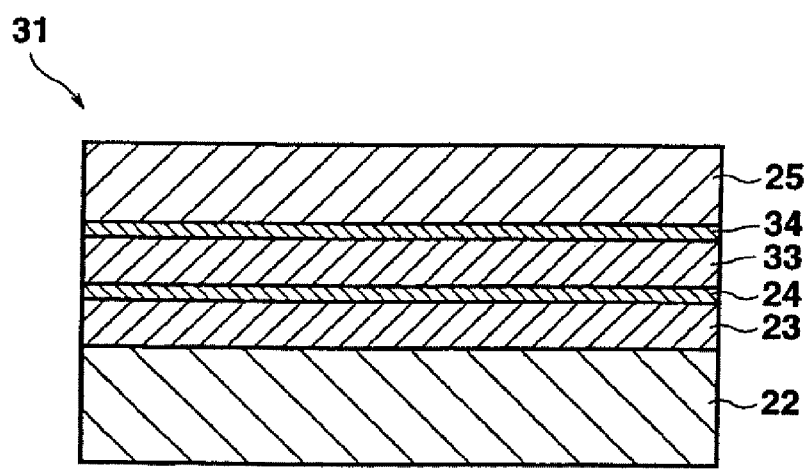
FIG. 3 is a sectional view showing another example of structure of the first electrode film of the present invention.
Figure 4:
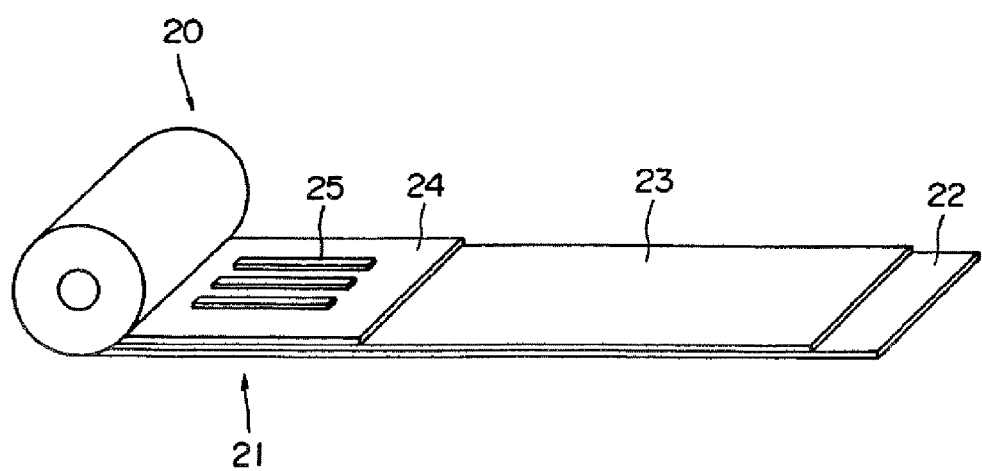
FIG. 4 is a perspective view showing an example of structure of a first rolled electrode film of the present invention.
Figure 5:
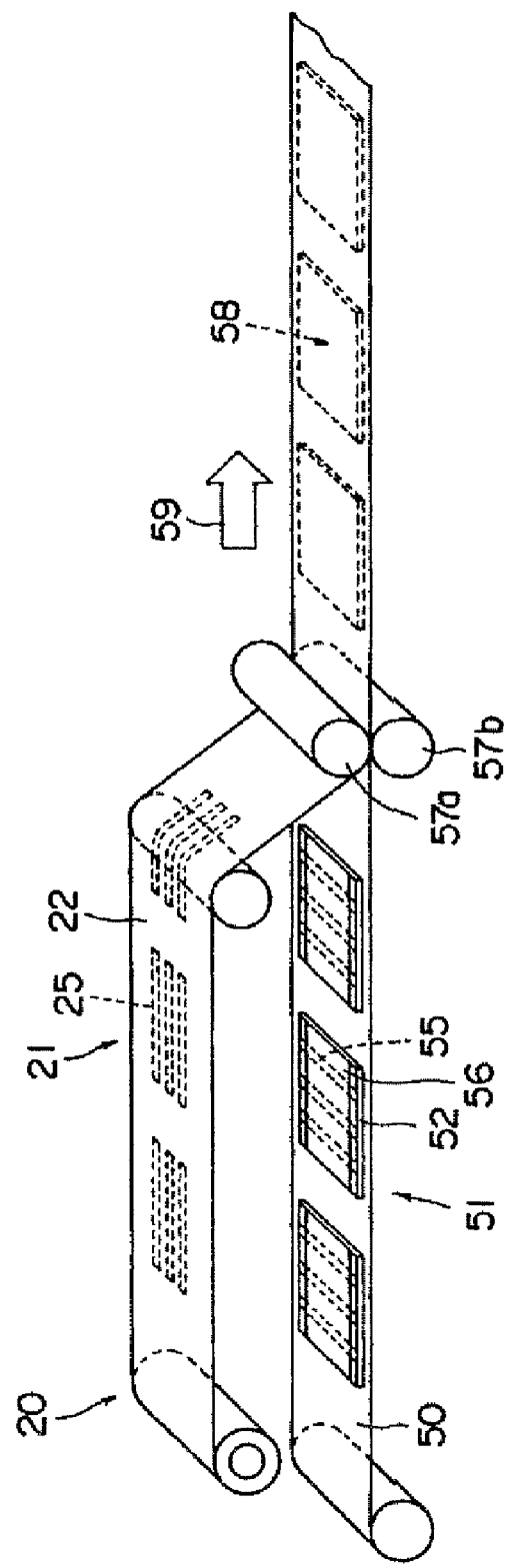
FIG. 5 illustrates an example of a process (first process) for preparation of an organic electroluminescence element of the present invention.
Figure 6:
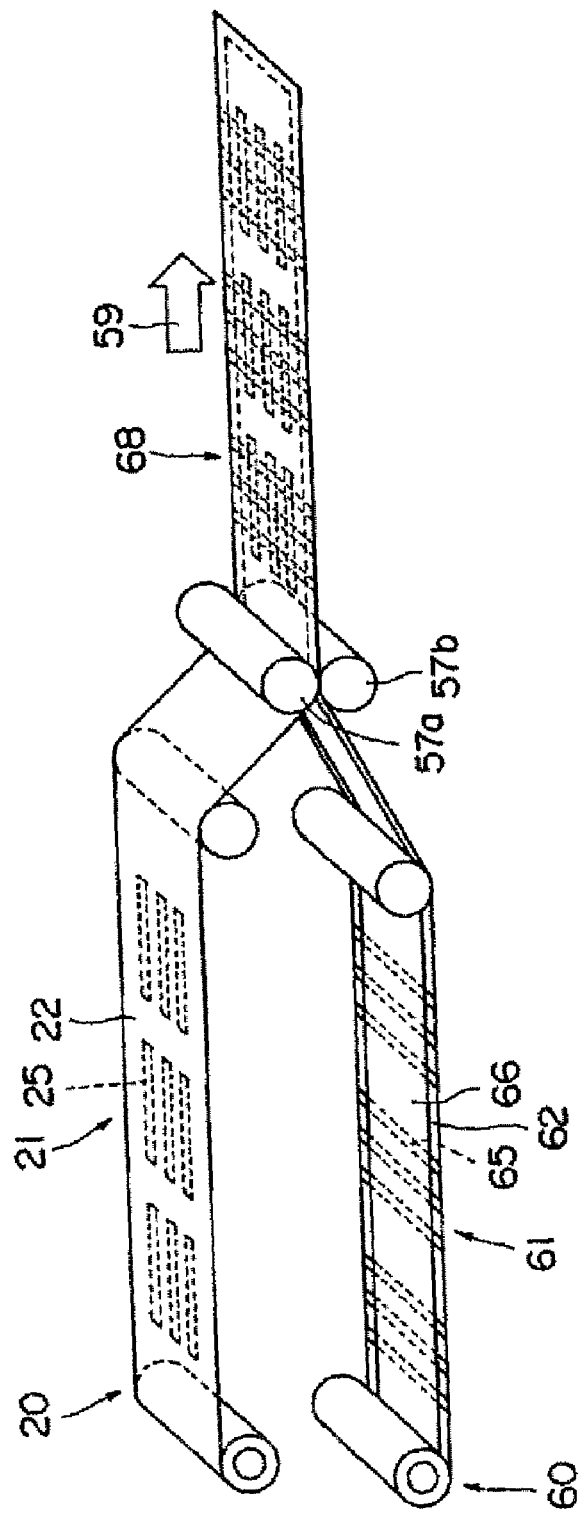
FIG. 6 illustrates another example of a process (first process) for preparation of an organic electroluminescence element of the present invention.
Figure 7:
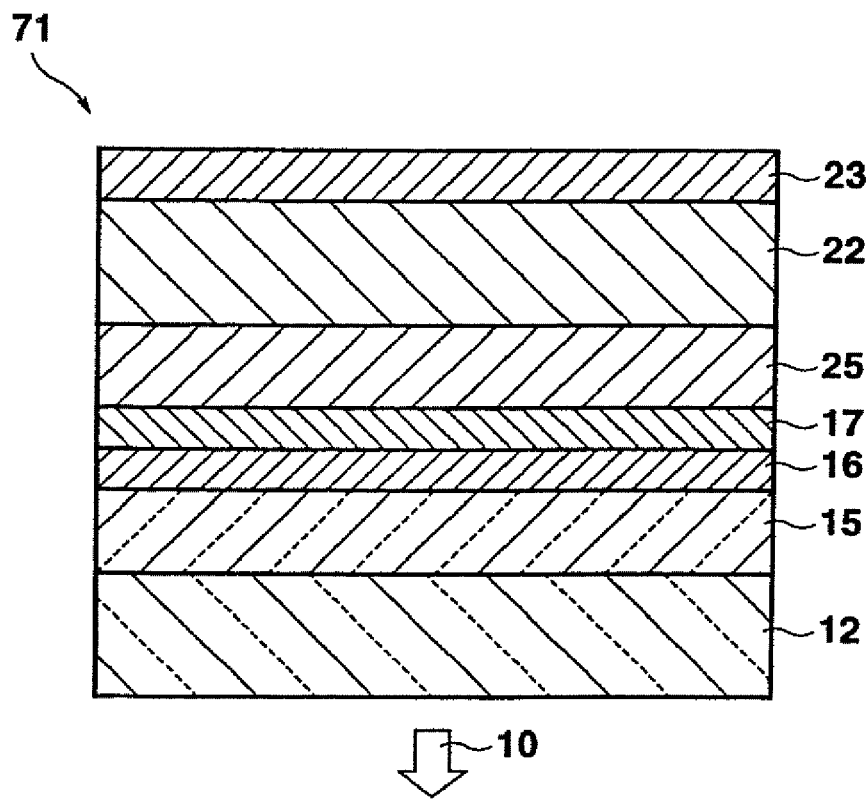
FIG. 7 is a sectional view showing an example of structure of a second organic electroluminescence element of the present invention.
Figure 8:
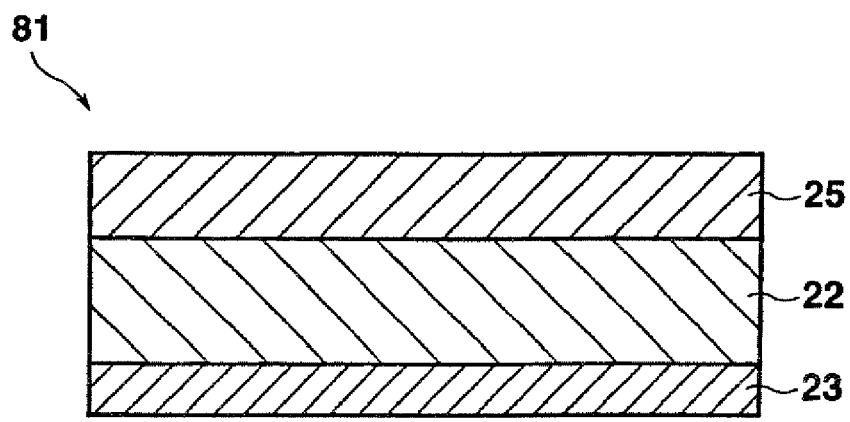
FIG. 8 is a sectional view showing an example of structure of a second electrode film of the present invention, which is used in preparation of the organic electroluminescence element shown in FIG. 7.
Figure 9:
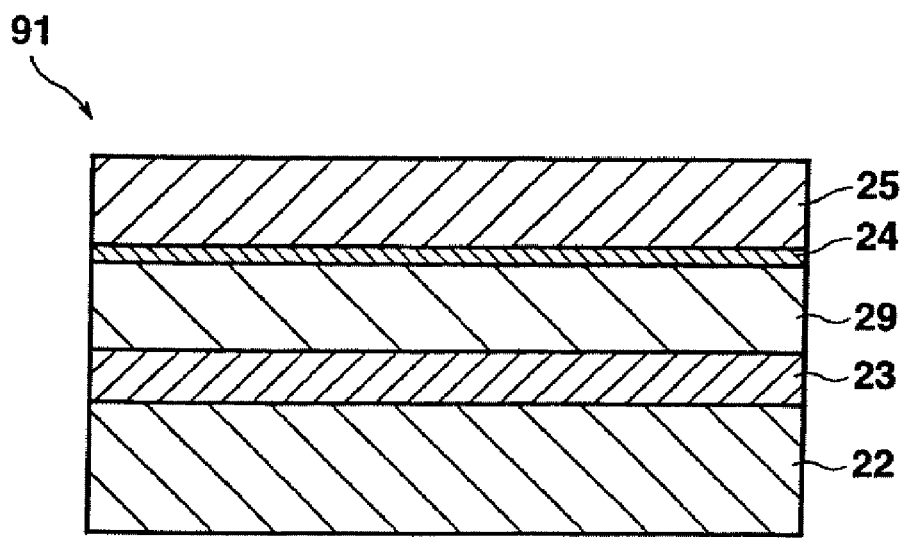
FIG. 9 is a sectional view showing a further example of structure of a first electrode film of the present invention.
Figure 10:
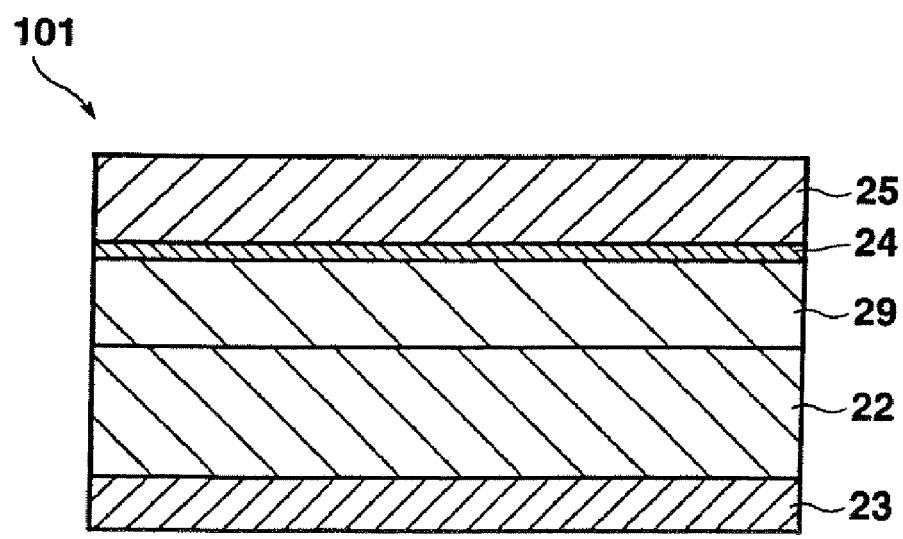
FIG. 10 is a sectional view showing another example of structure of a second electrode film of the present invention.

11 Organic electroluminescence element
12 Transparent substrate
15 Anode layer
16 Positive hole-transporting layer
17 Light-emitting organic material layer
20 Rolled electrode film
21 Electrode film
22 Resin film
23 Metal layer
24 Insulating layer
25 Cathode layer
29 Hygroscopic material layer
31 Electrode film
33 Metal layer
34 Insulating layer
50 Substrate-conveying film
51 Electrode substrate
52 Transparent substrate
55 Anode layer
56 Organic material layer
57a Heating roll
57b Heating roll
58 Organic electroluminescence element
59 Arrow indicating direction to convey electrode film 60 Rolled electrode substrate
61 Electrode substrate
62 Resin film
65 Anode layer
66 Organic material layer
68 Organic electroluminescence element
71 Organic electroluminescence element
81 Electrode film
91 Electrode film
101 Electrode film

What is claimed is:

1. A process for preparation of an organic electroluminescence element comprising the steps of:
   preparing a positive electrode substrate comprising a transparent substrate, a transparent positive electrode formed on the substrate, and a light-emitting organic material layer formed on the positive electrode;
   preparing a roll of a negative electrode film comprising the negative electrode film and a core tube or a core tube covered with a metal film around which the negative electrode film is wound up with a tension of $2.5 \times 10^5$ to $4.0 \times 10^7$ N/m² in vacuum or in an atmosphere of an inert gas, the negative electrode film comprising an outer resin film, a metal layer formed on the resin film, and an inner opaque negative electrode layer formed on the metal layer
   unwinding the negative electrode film;
   placing the unwound negative electrode film on the positive electrode substrate under the condition that the negative electrode is placed on the light-emitting organic material layer; and
   pressing the positive electrode substrate and the negative electrode film while heating the organic material layer to soften the organic material layer whereby causing the negative electrode film to adhere to the positive electrode substrate.

2. The process of claim 1, in which the negative electrode film is pressed onto the positive electrode substrate using heating rolls.

3. The process of claim 1, in which the light-emitting organic material layer is formed on the positive electrode by coating a solution of the light-emitting organic material on the positive electrode and drying the coated light-emitting organic material.

4. The process of claim 1, in which the negative electrode layer is formed of a metal having a work function of 4 eV or less.

5. The process of claim 1, in which the negative electrode layer is formed of Mg-Ag.

6. The process of claim 1, in which the inner opaque negative electrode layer is formed on the metal layer via an intervening insulating layer.

7. The process of claim 1, in which the prepared roll of a negative electrode film is wrapped under reduced pressure or in an atmosphere of inactive gas.

* * * * *